United States Patent
Tomisaka et al.

(10) Patent No.: US 8,405,218 B2
(45) Date of Patent: Mar. 26, 2013

(54) SEMICONDUCTOR DEVICE AND METHOD OF PATTERNING RESIN INSULATION LAYER ON SUBSTRATE OF THE SAME

(75) Inventors: Manabu Tomisaka, Nagoya (JP); Michio Kameyama, Toyota (JP); Terukazu Fukaya, Nagoya (JP); Kazuhito Katoh, Inazawa (JP); Yutaka Fukuda, Kariya (JP); Akira Tai, Okazaki (JP); Kazuo Akamatsu, Okazaki (JP); Yoshiko Fukuda, legal representative, Kariya (JP); Yuji Fukuda, legal representative, Osaka (JP); Mika Ootsuki, legal representative, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 12/887,874

(22) Filed: Sep. 22, 2010

(65) Prior Publication Data

US 2011/0198733 A1    Aug. 18, 2011

(30) Foreign Application Priority Data

Oct. 14, 2009  (JP) ................................. 2009-237509

(51) Int. Cl.
*H01L 23/48*  (2006.01)
*H01L 23/52*  (2006.01)
*H01L 29/40*  (2006.01)
(52) U.S. Cl. ................ 257/758; 257/774; 257/E23.145
(58) Field of Classification Search .................. 257/211, 257/758, 774, 775, E23.145
See application file for complete search history.

(56) References Cited

U.S. PATENT DOCUMENTS

| | | | |
|---|---|---|---|
| 6,284,567 B1 * | 9/2001 | Park | 438/107 |
| 6,428,393 B1 | 8/2002 | Yukawa et al. | |
| 7,507,658 B2 * | 3/2009 | Usui et al. | 438/637 |
| 2005/0161814 A1 | 7/2005 | Mizukoshi et al. | |
| 2008/0113466 A1 | 5/2008 | Moriya et al. | |
| 2008/0217771 A1 | 9/2008 | Tomisaka et al. | |
| 2009/0042326 A1 * | 2/2009 | Yamazaki et al. | 438/29 |
| 2009/0051674 A1 * | 2/2009 | Kimura et al. | 345/204 |
| 2009/0075214 A1 * | 3/2009 | Hirakata et al. | 430/319 |

FOREIGN PATENT DOCUMENTS

| | | |
|---|---|---|
| JP | B2-3069468 | 3/1995 |
| JP | A-11-320241 | 11/1999 |
| JP | A-2005-012098 | 1/2005 |
| JP | A-2006-186304 | 7/2006 |

OTHER PUBLICATIONS

"A new flip-chip bonding method using ultra-precision cutting of metal/adhesive layers" by Sakai et al., ICEP Outstanding Papers of the 2007 Conference (vol. 11 No. 3 2008 pp. 217-222).
Office Action in the corresponding CN Patent Application No. 201010292890.X dated Aug. 31, 2012 (and English translation).

* cited by examiner

*Primary Examiner* — Hoai V Pham
(74) *Attorney, Agent, or Firm* — Posz Law Group, PLC

(57) ABSTRACT

In a method of manufacturing a semiconductor device, an electrode layer is formed on a surface of a semiconductor substrate, and a resin insulation layer is formed on the surface of the semiconductor substrate so that the electrode layer can be covered with the resin insulation layer. A tapered hole is formed in the insulation layer by using a tool bit having a rake angle of zero or a negative value. The tapered hole has an opening defined by the insulation layer, a bottom defined by the electrode layer, and a side wall connecting the opening to the bottom.

8 Claims, 9 Drawing Sheets

HORIZONTAL DIRECTION
TENSILE STRESS > STRENGTH

VERTICAL DIRECTION
TENSILE STRESS > STRENGTH

| LOT | TYPE | ELONGATION (%) | STRENGTH (MPa) | ELASTIC MODULUS (GPa) | Rz | CUTTING SURFACE | EVALUATION |
|---|---|---|---|---|---|---|---|
| 1 | PIX 3400 | 60 | 150 | 3.0 | 117nm | | ○ |
| 2 | HD 4110 | 45 | 200 | 3.1 | 145nm | | ○ |
| 3 | HD 8820 | 102 | 170 | 2.1 | 732nm | | × |
| 4 | PIX 5878 | 95 | 260 | 2.3 | 487nm | | × |
| 5 | SP 483 | 50 | 140 | 3.0 | 121nm | | ○ |

FIRST RESIN TYPE

SECOND RESIN TYPE

SEMICONDUCTOR DEVICE AND METHOD OF PATTERNING RESIN INSULATION LAYER ON SUBSTRATE OF THE SAME

CROSS REFERENCE TO RELATED APPLICATION

This application is based on and incorporates herein by reference Japanese Patent Application No. 2009-237509 filed on Oct. 14, 2009.

FIELD OF THE INVENTION

The present invention relates to a semiconductor device and a method of patterning a resin insulation layer on a substrate of the semiconductor device.

BACKGROUND OF THE INVENTION

As disclosed, for example, in JP-3069468, it is well known that photolithography, which uses a chemical reaction, is employed to selectively remove an insulation layer of a semiconductor device such as a metal-oxide semiconductor (MOS) device so as to form a hole in the insulation layer.

In particular, in a semiconductor device such as a power transistor, a resin insulation layer is used to electrically insulate electrodes and trace patterns on a surface of a substrate. The resin insulation layer is patterned through processes of exposure, development, and etching in photolithography. However, this method can involve the following problems:

1. As an insulation layer is thicker, the time required to etch the insulation layer becomes longer.
2. There is a trade-off between a thickness of the insulation layer and a pattern size of the insulation layer. In the case of a thick insulation layer, it is difficult to form a fine pattern of the insulation layer.
3. It is difficult to form a tapered hole having a desired taper angle in the insulation layer.
4. A surface of the insulation layer is raised around an opening of the tapered hole.

Therefore, there has been a demand for a method of forming a tapered hole having a desired taper angle in a resin insulation layer regardless of the thickness of the resin insulation layer.

Some methods other than photolithography have been proposed to pattern a resin insulation layer on a semiconductor substrate.

In a method disclosed in JP 2005-12098A, WO 2004/061935, JP 2006-186304A, and U.S. Pat. No. 6,428,393 corresponding to JP 2000-173954A, a resin insulation layer on a semiconductor substrate is machined to planarize the resin insulation layer on the semiconductor substrate. However, since the resin insulation layer is patterned by using photolithography, it is difficult to form the resin insulation layer in a desired pattern.

In a method disclosed in US 2008/0113466 corresponding to JP 2008-124150A, a hole is formed in a resin insulation layer by using a cutting tool. However, since the hole is formed by scraping the resin insulation layer to one side, it is difficult to form the hole having a desired shape in the resin insulation layer. In particular, a surface of the resin insulation layer is raised around an opening of the hole.

A method disclosed in a non-patent document "A New Flip Bonding Method Using Ultra-precision Cutting of Metal/Adhesive Layers, International Conference on Electronics Packaging, Outstanding papers of the 2007 Conference" is used for planarization but is not used for patterning of a resin insulation layer.

SUMMARY OF THE INVENTION

In view of the above, it is an object of the present invention to provide a method of pattering a resin insulation layer on a substrate in a desired pattern regardless of a thickness of the resin insulation layer. It is another object of the present invention to provide a semiconductor device having the resin insulation layer.

According to an aspect of the present invention, a method of manufacturing a semiconductor device includes forming an insulation layer on a surface of a semiconductor substrate, and cutting out an unnecessary portion of the insulation layer by using a tool bit. Preferably, the method can further include forming an electrode layer on the surface of the semiconductor substrate. The forming of the insulation layer can include covering the electrode layer with the insulation layer. The cutting out of the unnecessary portion of the insulation layer can include forming a tapered hole by using the tool bit. The tapered hole can have an opening defined by the insulation layer, a bottom defined by the electrode layer, and a side wall connecting the opening to the bottom. A rake angle of the tool bit can be zero or a negative value.

According to another aspect of the present invention, a semiconductor device includes a semiconductor substrate, an electrode layer located on a surface of the semiconductor substrate, and a resin insulation layer located on the surface of the semiconductor substrate to partially cover the electrode layer. The resin insulation layer and the electrode layer define a tapered hole. An opening of the tapered hole is defined by the resin insulation layer. A bottom of the tapered hole is defined by a first portion of the electrode layer. A side wall of the tapered hole connects the opening to the bottom. The electrode layer has a first thickness at the first portion and a second thickness at a second portion that is covered with the resin insulation layer. The first thickness is less than the second thickness. A step portion between the first portion and the second portion of the electrode layer and a side portion of the resin insulation layer define the side wall of the tapered hole. An angle between the step portion of the electrode layer and the bottom of the tapered hole is equal to an angle between the side portion of the resin insulation layer and the bottom of the tapered hole. A lower end of the side portion of the resin insulation layer is continuously joined to an upper end of the step portion of the electrode layer to form a continuous surface.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

The present inventors have studied the above-mentioned problems in the prior-art. First, the results of the studies are described below.

In a semiconductor device such as a power transistor for handling a large amount of current, an electric current flows in a thickness direction while uniformizing the electric current in a surface direction. Therefore, wires and electrodes generally have a thickness of about several micrometers (μm), e.g., 5 μm. Since it is difficult to entirely cover such wires and electrodes with a layer (e.g., silicone nitride layer) that is formed by chemical vapor deposition, a resin insulation layer is used to cover such wires and electrodes. In this case, the resin insulation layer needs to have a thickness of 10 μm or more, for example. Further, the semiconductor device is generally packaged with molding resin to improve environmental resistance. As a result, local stress due to fillers in the molding resin may be applied to the semiconductor device and affect device characteristics. Therefore, the resin insulation layer needs to have a thickness large enough to reduce the local stress.

Figure 1:
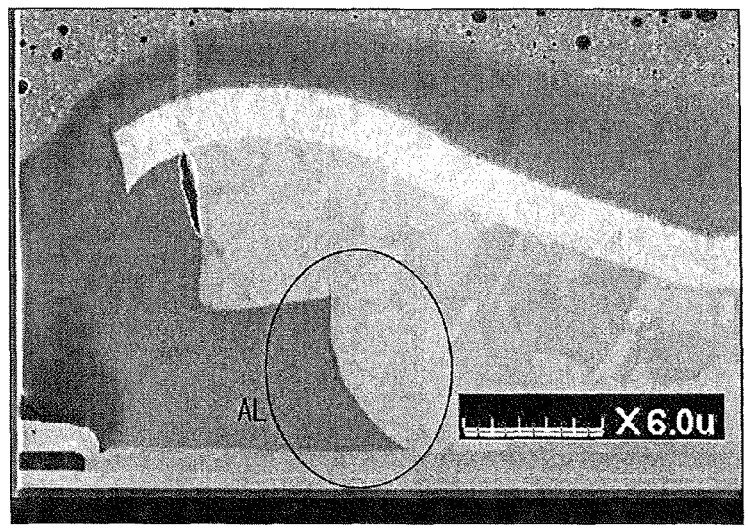
FIG. 1 is a diagram illustrating a cross-sectional photograph of a resin insulation layer patterned by photolithography.
Figure 2:
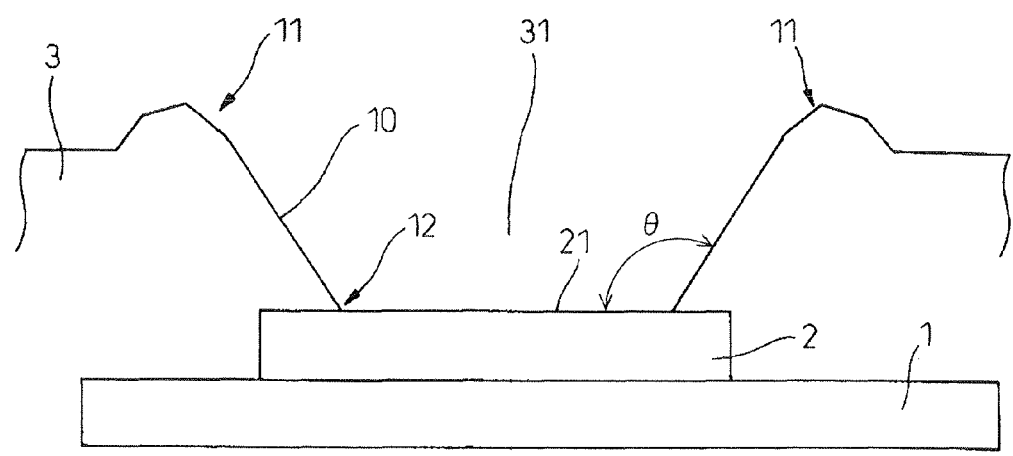
FIG. 2 is a diagram illustrating a semiconductor device having a resin insulation layer patterned by photolithography.

In view of cost advantages, photolithography including a development step and an etching step (e.g., fast isotropic wet etching) is generally used for patterning of the resin insulation layer. FIG. 1 is a photograph showing a cross-sectional view of a resin insulation layer that is patterned by using photolithography. In FIG. 1, a portion enclosed by a circle represents a side wall of a tapered hole formed in the resin insulation layer. It is noted that "6.0 u" in FIG. 1 means "6.0 μm". FIG. 2 is a diagram illustrating a semiconductor device having a resin insulation layer that is patterned by using photolithography. Problems caused when the resin insulation layer is patterned by using photolithography are discussed below with reference to FIGS. 1 and 2.

In development and wet etching steps, as shown in FIG. 2, a resin insulation layer 3 is patterned to form a tapered hole 31. A contact surface 21 of a first electrode layer 2 is exposed through the tapered hole 31. That is the contact surface 21 serves as a bottom of the tapered hole 31. Typically, the tapered hole 31 has a taper angle θ of from 110° to 140°. That is, the taper angle θ is obtuse. The taper angle θ is defined as an angle between a side wall 10 and the contact surface 21. When the taper angle θ is obtuse, additional area is required around the first electrode layer 2. As a result, the size of the semiconductor device is increased.

Further, as shown in FIG. 2, an upper portion 11 of the side wall 10 around an opening of the tapered hole 31 is raised. In this case, there is a concern that stress may be concentrated on the raised upper portion 11 in downstream manufacturing stages. As a result, properties of the resin insulation layer 3 may vary at the raised upper portion 11 and at other portions in the downstream manufacturing stages. Further, there is a concern that a lower portion 12 of the side wall 10 is sharpened due to the obtuse taper angle θ. As a result, the properties of the resin insulation layer 3 may also vary at the sharpened lower portion 12 and at other portions in the downstream manufacturing stages. Furthermore, there is a concern that the side wall 10 and the contact surface 21 may form a discontinuous surface. In such a case, it is likely that the resin insulation layer 3 and a second electrode layer (not shown) formed on the first electrode layer 2 are peeled from the first electrode layer 2.

Next, problems involved with a lift-off process are discussed below with reference to FIGS. 3A-3D.

Figure 3A:
FIGS. 3A-3D are diagrams illustrating a lift-of method.
Figure 3B:
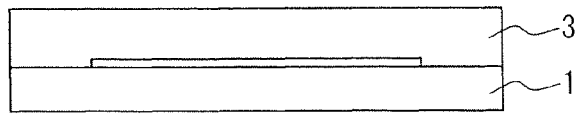
Figure 3C:
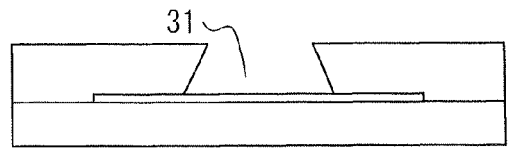
Figure 3D:
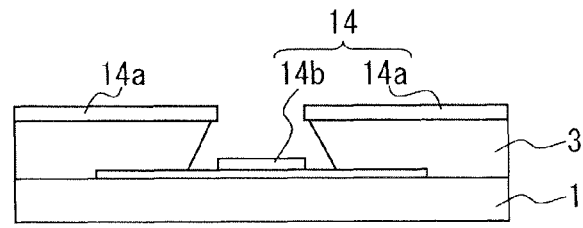

FIGS. 3A-3D are diagrams illustrating a lift-off process generally used for manufacture of Microelectromechanical systems (MEMS), electroluminescence (EL), or the like. In the lift-off process, as shown in FIG. 3A, a semiconductor substrate 1 is prepared. Then, as shown in FIG. 3B, a resin insulation layer 3 is formed on the semiconductor substrate 1. Then, as shown in FIG. 3C, a reverse-tapered hole 31 is formed in the resin insulation layer 3. Then, as shown in FIG. 3D, a second electrode layer 14 is formed through the reverse-tapered hole 31. As a result, a first portion 14a of the second electrode layer 14 is formed on the resin insulation layer 3, and a second portion 14b of the second electrode layer 14 is formed on the semiconductor substrate 1. Because of the shape of the reverse-tapered hole 31, the first portion 14a and the second portion 14b are electrically insulated from each other. For example, when the reverse-tapered hole 31 has an acute taper angle of about 60°, it is ensured that the first portion 14a and the second portion 14b are electrically insulated from each other.

In the case of a semiconductor device such as a power transistor for handling a large amount of current, the thickness of the resin insulation layer 3 is increased so that the resin insulation layer 3 can have a high breakdown voltage (e.g., several kilovolts or more). That is, as the thickness of the resin insulation layer 3 is larger, a distance between the first portion 14a and the second portion 14b in the thickness direction becomes larger so that the breakdown voltage of the resin insulation layer 3 can be improved.

Therefore, to use a lift-off process for manufacture of a semiconductor device, it is important to form a reverse-tapered hole with a relatively small acute taper angle (e.g., 60°) in a thick resin insulation layer.

Figure 4:
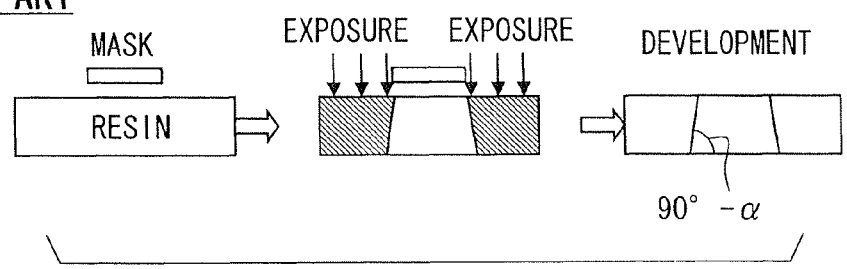
FIG. 4 is a diagram illustrating a method of forming a reverse-tapered hole by photolithography.

FIG. 4 is a diagram illustrating a method of forming a reverse-tapered hole in a resin insulation layer by using photolithography. Assuming that the resin insulation layer is made of negative photosensitive resin, a portion of the resin insulation layer that is exposed to light becomes insoluble to developer. An unexposed portion of the resin insulation layer covered with a mask is dissolved by the developer. Since the resin insulation layer is not completely transparent, the intensity of light applied to a lower portion of the resin insulation layer is weak. Therefore, the lower portion of the resin insulation layer that is exposed to light is dissolved by the developer so that the reverse-tapered hole can be formed in the resin insulation layer. Typically, according to the method shown in FIG. 4, the reverse-tapered hole has a slightly acute taper angle of 90°−α, where α is several degrees. In other words, according to the method shown in FIG. 4, it is difficult to form a reverse-tapered hole with a small acute taper angle (e.g., 60°).

Figure 5:
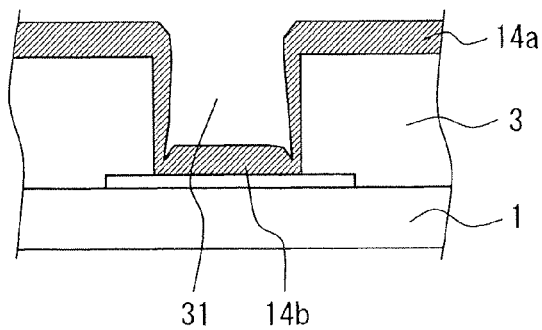
FIG. 5 is a diagram illustrating a method of forming an electrode layer through a non-tapered hole.

FIG. 5 is a diagram illustrating a case where the second electrode layer 14 is formed through a non-tapered hole 31 (i.e., with a taper angle of 90°) by a sputtering method or a vacuum deposition method. In this case, since metallic particles have diagonal velocity components, the metallic particles are deposited on a side wall of the non-tapered hole 31. As a result, the first portion 14a on the resin insulation layer 3 and the second portion 14b on the semiconductor substrate 1 cannot be electrically insulated from each other. Therefore, the lift-off process shown in FIGS. 3A-3D cannot be used to form the second electrode layer 14 through the non-tapered hole 31. For the same reason, it is difficult to use the lift-off process to form the second electrode layer 14 through the reverse-tapered hole 31 with a slightly acute taper angle of 90°−α that is formed by the method shown in FIG. 4.

It is not completely impossible to form a reverse-tapered hole with a small acute taper angle by using photolithography. However, in this case, the photosensitivity of the resin insulation layer, which is made of negative photosensitive resin, needs to be adjusted so that the resin insulation layer can contain a lot of functional groups that are cross-linkable by light energy. As a result, mechanical properties such as Young's modulus, elongation, strength, and heat resistance, and electric properties such as permittivity and dissipation factor of the resin insulation layer may be degraded.

Therefore, although a reverse-tapered hole with a small acute taper angle may be formed in the resin insulation layer by using photolithography, it is difficult to achieve an ideal balance among the photosensitivity, the mechanical properties, and the electric properties of the resin insulation layer.

Based on the above studies results, embodiments of the present invention are described below.

First Embodiment

A first embodiment of the present invention is described below with reference to FIGS. 6A-6E. FIGS. 6A-6D illustrate a method of manufacturing a semiconductor device according to the first embodiment, and FIG. 6E illustrates a partially detail view of the semiconductor device according to the first embodiment.

Figure 6A:
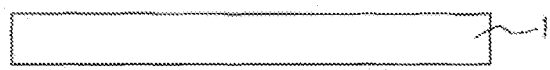
FIGS. 6A-6D are diagrams illustrating a method of manufacturing a semiconductor device according to a first embodiment of the present invention.
Figure 6B:
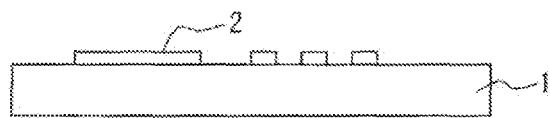
Figure 6C:
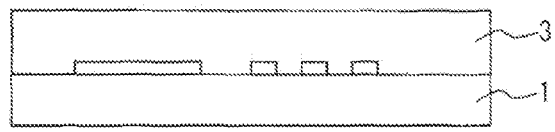
Figure 6D:
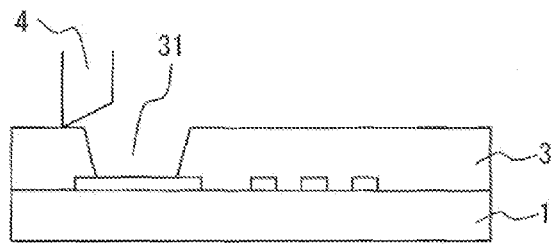
Figure 6E:
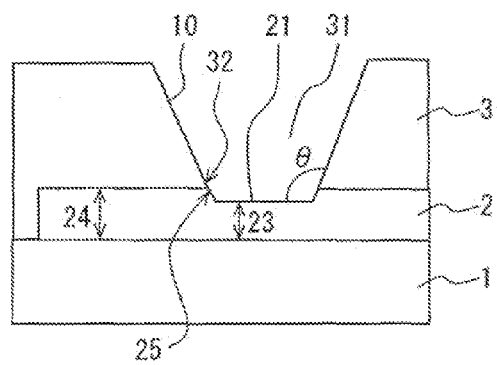
FIG. 6E is a diagram illustrating an enlarged view of the semiconductor device manufactured by the method of FIGS. 6A-6D.

In a process shown in FIG. 6A, a semiconductor substrate 1 is prepared. Then, in a process shown in FIG. 6B, a first electrode layer 2 is formed on a surface of the semiconductor substrate 1. Then, in a process shown FIG. 6C, a resin insulation layer 3 is formed on the surface of the semiconductor substrate 1 so that the first electrode layer 2 can be covered with the resin insulation layer 3. Then, in a process shown in FIG. 6D, a tapered hole 31 is formed in the resin insulation layer 3 by cutting out an unnecessary portion of the resin insulation layer 3 so that the first electrode layer 2 can be exposed through the tapered hole 31. Specifically, in the process shown in FIG. 6D, the tapered hole 31 is formed by using a tool bit 4 having a rake angle of zero or a negative value.

As described above, according to the first embodiment, the first electrode layer 2 is reduced in the thickness at the contact surface 21. That is, in the process shown in FIG. 6D, the first electrode layer 2 is cut out at the contact surface 21 by the tool bit 4. Therefore, the contact surface 21 becomes clean so that the first electrode layer 2 can suitably form a metallic bond with a second electrode layer 14 (refer to FIG. 3) that is formed on the contact surface 21. Thus, it is less likely that the first electrode layer 2 and the second electrode layer 14 are peeled from each other, for example, even when a temperature changes.

Further, although stress is concentrated on a corner of the tapered hole 31, an interface between the resin insulation layer 3 and the first electrode layer 2 is not located at the corner of the tapered hole 31. Therefore, it is less likely that the first electrode layer 2 and the resin insulation layer 3 are peeled from each other.

In an example shown in FIGS. 6A-6E, the tapered hole 31 is a non-reverse tapered hole. Alternatively, the tapered hole 31 can be a reverse tapered hole. That is, the method according to the first embodiment can allow the tapered hole 31 to have a desired taper angle. It is noted that the shape of the cutting surface of the resin insulation layer 3 can depend on the shape of the side surface of the tool bit 4. Therefore, for example, the tapered hole 31 with the desired taper angle can be formed by moving the tool bit 4 having the side surface inclined at an angle equal to the desired taper angle in the resin insulation layer 3.

For example, in the case of a non-reverse tapered hole, it is preferable that the taper angle should be 135° or less. In the case of a reverse tapered hole for a lift-off process, it is preferable that the taper angle should be 80° or less, and it is more preferable that the taper angle should be in the range of about 55° to about 65°.

In this way, the tapered hole 31 formed in the resin insulation layer 3 can have a desired taper angle, even when the resin insulation layer 3 is thick. Therefore, the thickness of the resin insulation layer 3 can be increased so that the resin insulation layer 3 can have a high breakdown voltage. Further, since the tapered hole 31 can have a small acute taper angle of about 60°, the second electrode layer 14 (refer to FIG. 3) can be formed through the tapered hole 31 by a sputtering method or a vacuum deposition method in the lift-off process.

It is preferable that the opening of the tapered hole 31 should have a round shape with a radius of curvature equal to or greater than 1 μm. Further, it is preferable that the bottom of the tapered hole 31 should have a round shape with a radius of curvature equal to or greater than 1 μm.

Figure 6F:
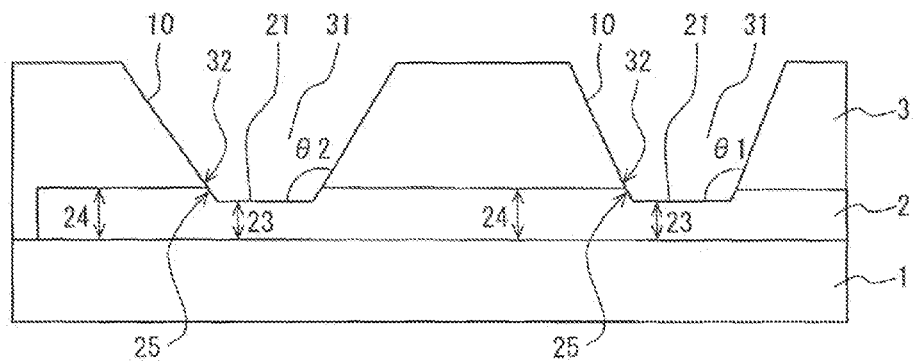
FIG. 6F is a diagram illustrating an enlarged view of an embodiment of a semiconductor device.

Further, according to the first embodiment, as shown in FIG. 6F, multiple tapered holes 31 having different taper angles θ1 and θ2 can be easily formed by using numerical control (NC) machine or the like. A first angle is formed between the side wall and the bottom of a first one of the plurality of tapered holes, a second angle is formed between the side wall and the bottom of a second one of the plurality of tapered holes, and the first angle is different than the second angle.

For example, the tapered hole 31 can be formed by causing the tool bit 4 to move in a three-dimensional space while keeping the semiconductor substrate 1 fixed. Alternatively, the tapered hole 31 can be formed by causing the semiconductor substrate 1 and the tool bit 4 to move with respect to each other in a three-dimensional space. For example, the tapered hole 31 can be formed by causing the semiconductor substrate 1 to move in a direction of a X-axis, causing the tool bit 4 to move in a direction of a Y-axis, and causing the tool bit 4 to move in a direction of a Z-axis as a cutting axis. It is noted that the X-axis, the Y-axis, and the Z-axis form a Cartesian coordinate system.

After the first electrode layer 2 and the resin insulation layer 3 are formed on the semiconductor substrate 1, the semiconductor substrate 1 may have a thickness variation. Therefore, if one side of the semiconductor substrate 1 is fixed to a flat plane, the other side of the semiconductor substrate 1 is undulating with a height difference of a few micrometers (e.g., 7 µm). As a result, it is difficult to accurately form the tapered hole 31. For example, according to the first embodiment, the tapered hole 31 needs to have a depth of 3±1 micrometers. In such a case, the thickness variation of the semiconductor substrate 1 cannot be negligible.

To solve this problem, according to the first embodiment, one side of the semiconductor substrate 1 is sucked and held by a chuck table (not shown) so that the other side of the semiconductor substrate 1 can be flat. It is noted that the first electrode layer 2 and the resin insulation layer 3 define the other side of the semiconductor substrate 1.

The chuck table has a sucking surface and a hollow portion. A sucking hole is formed on the sucking surface. When the hollow portion is decompressed by a vacuum apparatus such as a vacuum pump, sucking force is applied to the one side of the semiconductor substrate 1 through the sucking hole so that the semiconductor substrate 1 can be sucked to the sucking surface of the chuck table.

It is noted that the sucking surface is deformable. The chuck table includes a deformation device having multiple piezoelectric actuators. The piezoelectric actuators are placed in the hollow portion and arranged at predetermined intervals in a grid pattern, for example. The piezoelectric actuators are in contact with a back surface of the sucking surface to cause the sucking surface to be displaced in an upward direction. When the sucking surface is displaced in the upward direction, the semiconductor substrate 1 on the sucking surface is displaced in the upward direction accordingly. In this way, the semiconductor substrate 1 is deformed so that the other side of the semiconductor substrate 1 can be flat.

Specifically, a shape of the other side of the semiconductor substrate 1 is measured in a noncontact manner by a profilometer such as a laser displacement gauge. Then, the piezoelectric actuators are activated to compensate for a displacement measured by the profilometer so that the other surface of the semiconductor substrate 1 can be flat. In such an approach, even when the semiconductor substrate 1 has the thickness variation, the tapered hole 31 can be accurately formed in the other side of the semiconductor substrate 1.

According to the first embodiment, for example, a numerical control (NC) cutting machine "AMG-42P", which is manufactured by NACHI-FUJIKOSHI corporation, can be used to form the tapered hole 31. It is noted that a cutting machine used to form the tapered hole 31 is not limited to "AMG-42P". It is preferable that the tool bit 4 should be a diamond bit.

As described in detail later, during cutting of a resin insulation layer, tensile stress is applied to the resin insulation layer immediately behind an edge of the tool bit. It is likely that local tensile stress exceeds rupture strength of the resin insulation layer at the time when the tool bit is inserted in the resin insulation layer to start the cutting and at the time when the tool bit is removed from the resin insulation layer to finish the cutting. If the local tensile stress exceeds the rupture strength of the resin insulation layer, the resin insulation layer is cracked. To prevent this problem, according to the first embodiment, a rake angle of the tool bit 4 is set to zero or a negative value. In such an approach, compressive stress is generated around the edge of the tool bit 4 so that the local tensile stress can be cancelled by the compressive stress. Thus, the cutting surface of the resin insulation layer 3 can be smoothed.

The edge and side of the tool bit 4 is sharpened. The side of the tool bit 4 is inclined at an angle equal to the taper angle (i.e., 50°) of the tapered hole 31. In such an approach, the tapered hole 31 having the taper angle can be formed by moving the tool bit 4 in the resin insulation layer 3 at a predetermined feed speed (e.g., 70 µm).

When the resin insulation layer 3 made of polyimide is cut to a depth of 8 µm or less to form the tapered hole 31, the cutting surface of the resin insulation layer 3 (i.e., the side wall 10 of the tapered hole 31) can be smooth. In contrast, when the resin insulation layer 3 made of polyimide is cut to a depth of more than 8 µm to form the tapered hole 31, it is likely that the cutting surface of the resin insulation layer 3 will be cracked due to an increase in stiffness of cutting dust. Therefore, when there is a need to form the tapered hole 31 having a depth of more than 8 µm, it is preferable that the cutting of the resin insulation layer 3 to a depth of 8 µm or less should be performed several times. For example, the tapered hole 31 having a depth of 18 µm can be formed by performing the cutting of the resin insulation layer 3 to a depth of 6 µm three times.

Figure 7A:
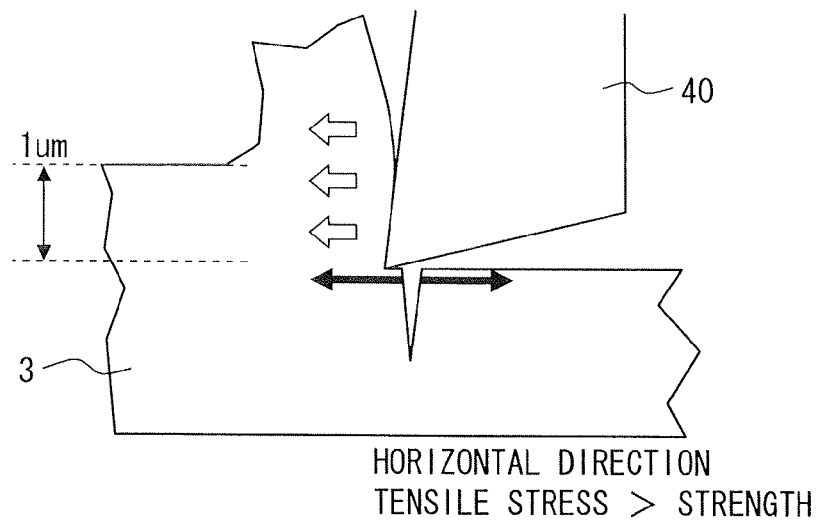
FIGS. 7A and 7B are diagram illustrating a crack caused in a resin insulation layer when the resin insulation layer is cut out by a conventional method.
Figure 7B:
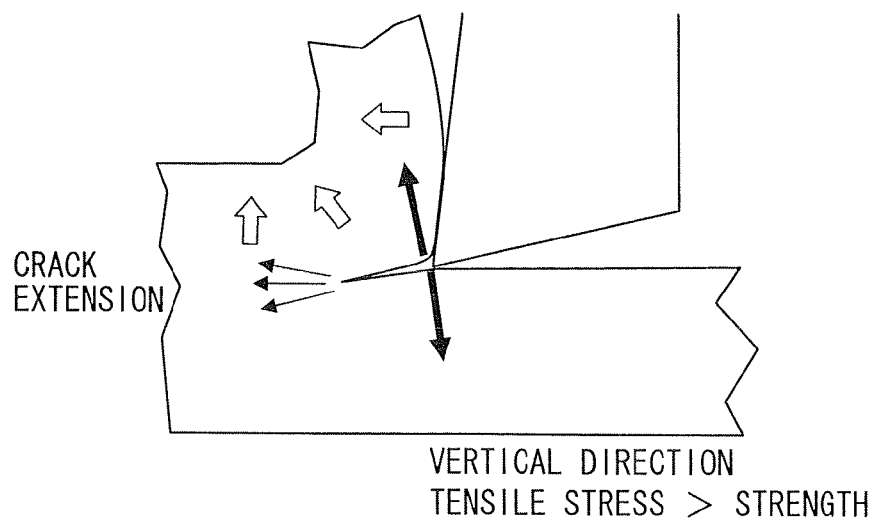
Figure 8:
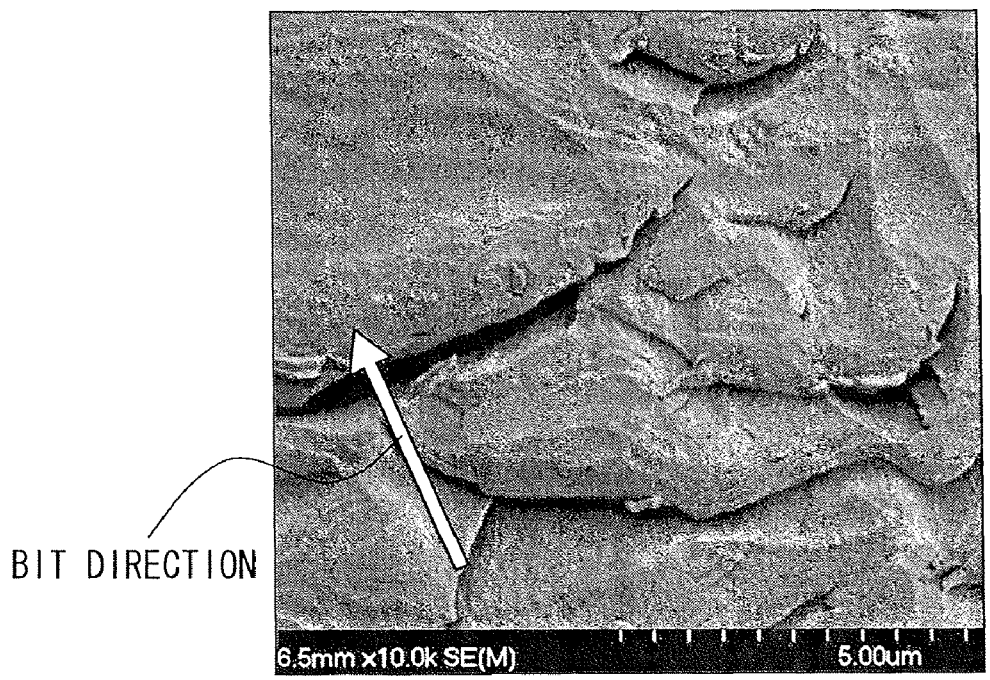
FIG. 8 is an enlarged photograph of the crack caused in the resin insulation layer when the resin insulation layer is cut out by the conventional method.

Below, problems caused when the resin insulation layer 3 is cut out using a tool bit 40 by a conventional technique are described with reference to FIGS. 7A, 7B, and 8. In FIGS. 7A, 7B, and FIG. 8, a hollow arrow indicates a direction of movement of the tool bit 40.

As shown in FIGS. 7A and 7B, when the resin insulation layer 3 is cut out using the tool bit 40, tensile stress is applied to the resin insulation layer 3 immediately behind an edge of the tool bit 40. Therefore, it is likely that local tensile stress exceeds rupture strength of the resin insulation layer 3. If the local tensile stress exceeds the rupture strength of the resin insulation layer 3, the resin insulation layer 3 is cracked as shown in FIGS. 7A and 7B. FIG. 7A illustrates a case where a crack occurs in the resin insulation layer 3 due to the fact that the tensile stress exceeds the rupture strength of the resin insulation layer 3 immediately behind the edge of the tool bit 40. FIG. 7B illustrates a case where a crack is automatically extended ahead of the edge of the tool bit 40. FIG. 8 is an enlarged photograph of a cracked resin insulation layer 3.

For example, whereas the resin insulation layer 3 needs to be cut to an accuracy of from ±1 µm to ±100 nm, the thickness of the semiconductor substrate 1 has tolerance of from 3 µm to 8 µm. A thickness variation occurs at a randomly point on one semiconductor wafer. Therefore, when the resin insulation layer 3 is formed on one side of the semiconductor substrate 1 and cut with respect to the other side of the semiconductor substrate 1 by fixing the other side of the semiconductor substrate 1 to a flat plane, the resin insulation layer 3 may be excessively or insufficiently cut.

Further, a thickness variation occurs in the first electrode layer 2 and the resin insulation layer 3 formed on the semiconductor substrate 1. As a result, in the case of a six-inch wafer, the total thickness variation can reach about 7 µm. Therefore, when the other side of the semiconductor substrate 1 is fixed to a flat plane, the surface of the resin insulation layer 3 on the semiconductor substrate 1 has a roughness of about 7 µm. For this reason, it is difficult to cut the resin insulation layer 3 with nano level accuracy.

In order to solve the above problems involved with the conventional technique, according to the first embodiment, the tool bit 4 has a rake angle of zero or a negative value, and the tapered hole 31 is formed in the resin insulation layer 3 by using the tool bit 4 while holding the semiconductor substrate 1 by the chuck table so that the surface shape of the resin insulation layer 3 can be flat.

It is preferable that the resin insulation layer 3 have a breaking elongation of 60% or less. In such an approach, the cutting surface of the resin insulation layer 3 can be smooth. A reason for this is described in detail below with reference to FIGS. 9A, 9B, 10, and 11A-11C. In FIG. 10, a hollow arrow indicates a direction of movement of the tool bit 4.

Figures 9A, 9B:
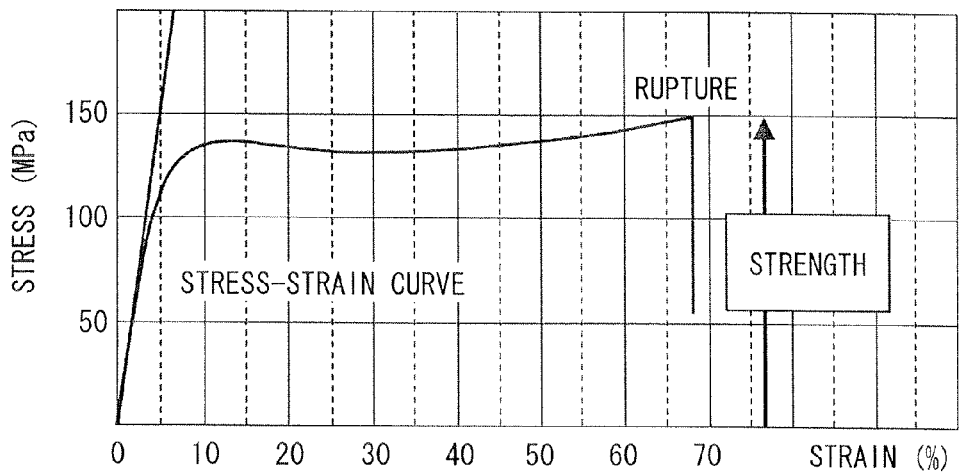
FIG. 9A illustrates a result of an experiment conducted by the present inventors to measure a surface roughness of a cutting surface of a resin insulation layer that is cut out by the method according to the first embodiment.
FIG. 9B illustrates a typical stress-strain curve.
Figure 10:
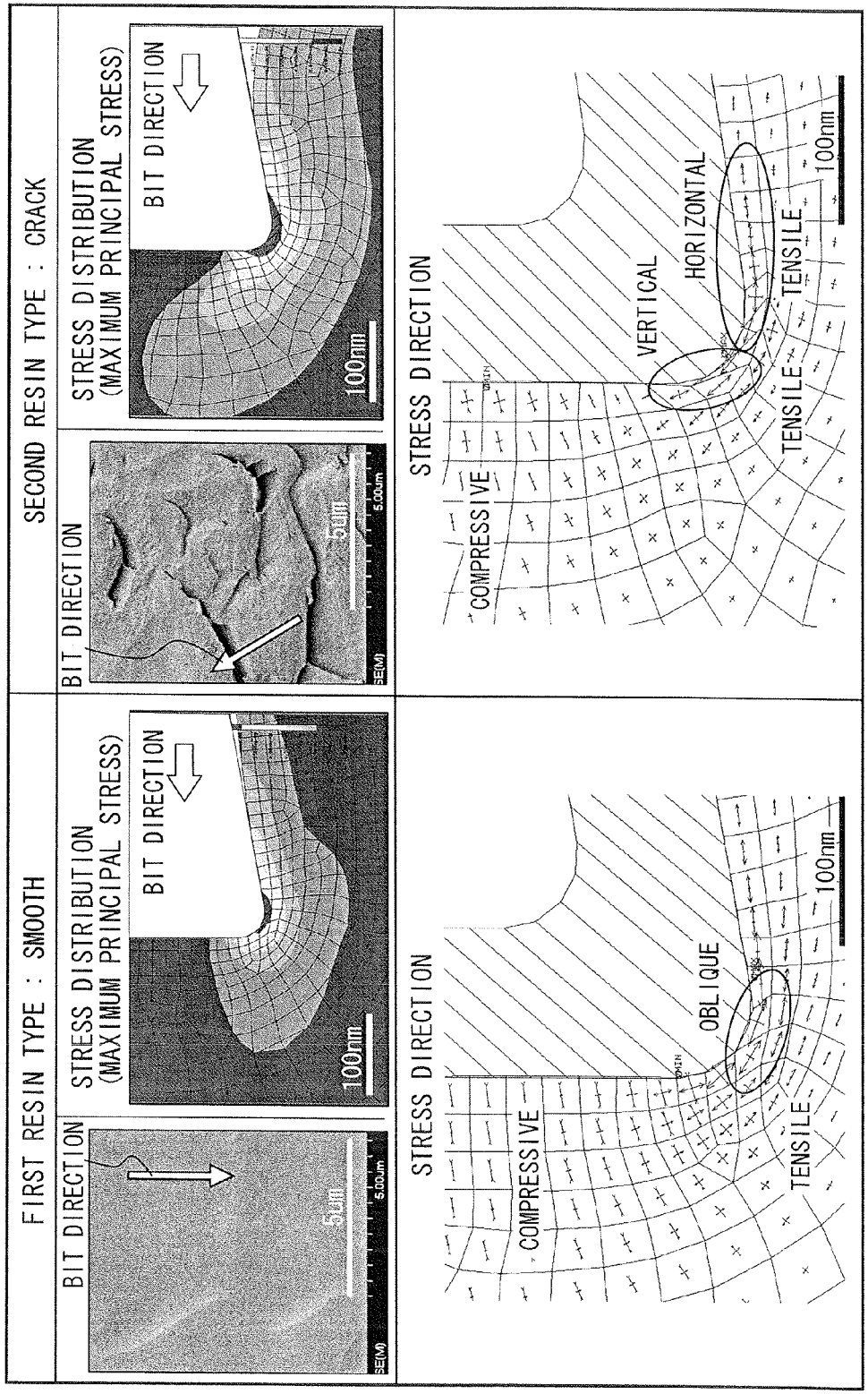
FIG. 10 illustrates a result of an experiment conducted by the present inventors to measure a stress distribution in each of first and second type resin insulation layers during a period of time when the resin insulation layer is cut out by a tool bit.

FIG. 9A illustrates a result of an experiment conducted by the present inventors to measure a surface roughness Rz of a cutting surface of a resin insulation layer that is cut by the method according to the first embodiment. FIG. 9B illustrates a typical stress-strain curve. Lot1 represents a case where the resin insulation layer is made of PIX3400, which is polyimide of Hitachi DuPont MicroSystems, LLC. Lot2 represents a case where the resin insulation layer is made of HD4110, which is polyimide of Hitachi DuPont MicroSystems, LLC. Lot3 represents a case where the resin insulation layer is made of HD8820, which is polyimide of Hitachi DuPont MicroSystems, LLC. Lot4 represents a case where the resin insulation layer is made of PIX5878, which is polyimide of Hitachi DuPont MicroSystems, LLC. Lot5 represents a case where the resin insulation layer is made of SP483, which is polyimide of Toray Industries, Inc. As can be seen from FIGS. 9A and 9B, when the resin insulation layer has a breaking elongation of 60% or less, the surface roughness Rz of the cutting surface of the resin insulation layer is small. The surface roughness Rz is measured as a 10-point average roughness defined in Japanese Industrial Standard (JIS). It is noted that although a 10-point average roughness defined in JIS is measured based on ten points (i.e., five highest peak points and five lowest valley points), the surface roughness Rz is measured based on six points (i.e., three highest peak points and three lowest valley points) for the sake of simplicity.

Figure 11A:
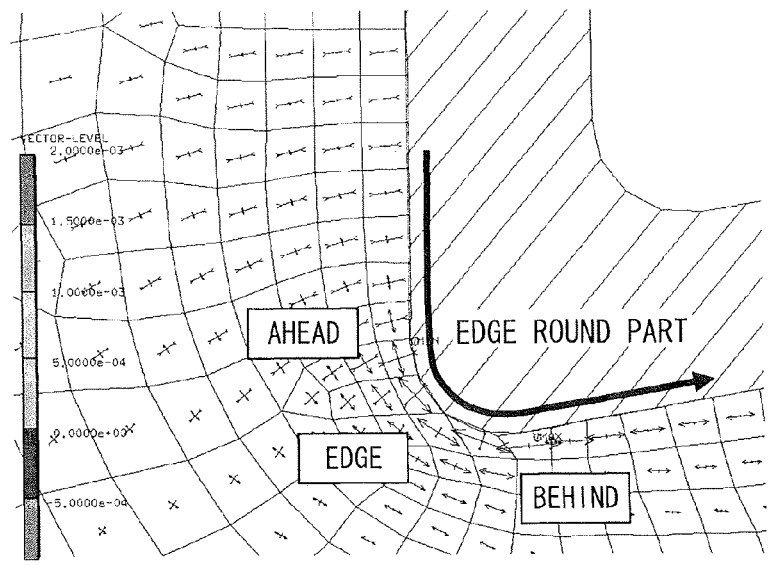
FIGS. 11A and 11B illustrate the stress distribution in the first resin layer during a period of time when the first resin insulation layer is cut out by the tool bit.
Figure 11B:
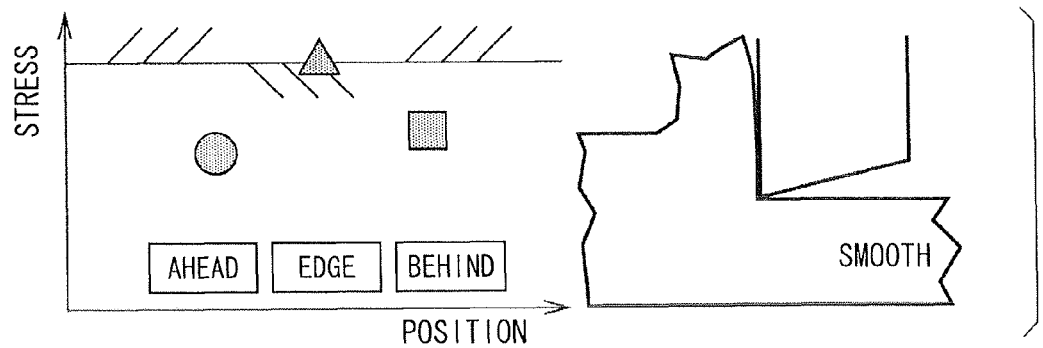
Figure 11C:
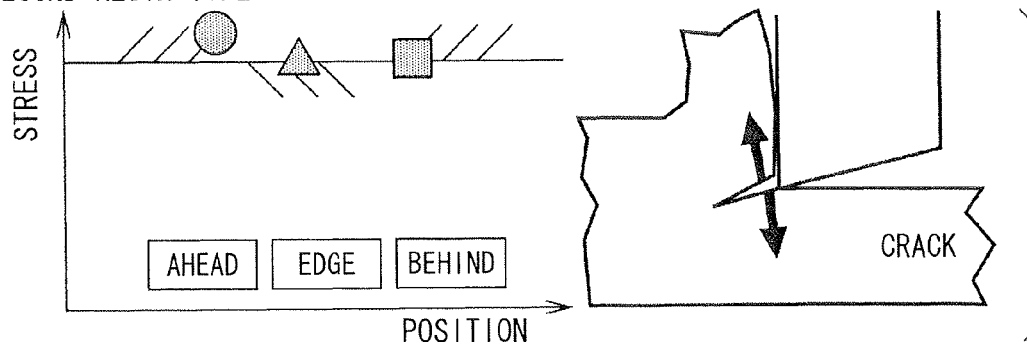
FIG. 11C illustrates the stress distribution in the second resin layer during a period of time when the second resin insulation layer is cut out by the tool bit.

Further, using a real measurement and a computer aided engineering (CAE), the present inventors have analyzed distribution of stress applied by an edge of a bit to a resin insulation layer during the cutting of the resin insulation layer. In the analysis, two resin insulation layers made of different types of resin were used. As shown in FIG. 10, a first type resin insulation layer has a breaking elongation of 60%, a strength of 140 MPa, a modulus of elasticity of 3.0 GPa, and a surface roughness of 120 nm, and a second type resin insulation layer has a breaking elongation of 102%, a strength of 139 MPa, a modulus of elasticity of 2.1 GPa, and a surface roughness Rz of 700 nm. That is, the first type resin insulation layer is made of PIX3400, and the second type resin insulation layer is made of HD8820. It is noted that the properties such as the strength vary depending on lot. FIGS. 11A and 11B illustrate a stress distribution in the first resin layer during the cutting, and FIG. 11C illustrates a stress distribution in the second resin layer during the cutting. As can be seen from FIG. 10, whereas the cutting surface of the first type resin insulation layer with a small breaking elongation of 60% is smooth, the cutting surface of the second type resin insulation layer with a breaking elongation of 102% is cracked. Further, as can be seen from FIG. 10, whereas stress applied by the tool bit to the first type resin insulation layer is concentrated on the edge of the tool bit, stress applied by the tool bit to the second type resin insulation layer is distributed over the edge of the tool bit.

Based on the result of the analysis, the present inventors have concluded that the surface roughness of the cutting surface of the resin insulation layer and the breaking elongation of the resin insulation layer have the following relationship. The first type resin insulation layer is elongated by the edge of the tool bit and broken when elongated to about 60%. The second type resin insulation layer is elongated by the edge of the tool bit and broken when elongated to about 105%. It can be estimated that as the elongation is larger, tensile stress applied to the resin insulation layer behind the edge of the bit becomes larger. In the case of the second type resin insulation layer, the tensile stress can be considerably large over the range of elongation of from 95% to 105%. The large tensile stress causes a crack in the cutting surface. Therefore, whereas the first type resin insulation layer has a smooth cutting surface, the second type resin insulation layer has a cracked cutting surface.

In view of the above, it is preferable that the resin insulation layer 3 have a breaking elongation of 60% or less.

Second Embodiment

A second embodiment of the present invention is described below with reference to FIGS. 12A and 12B.

Figure 12A:
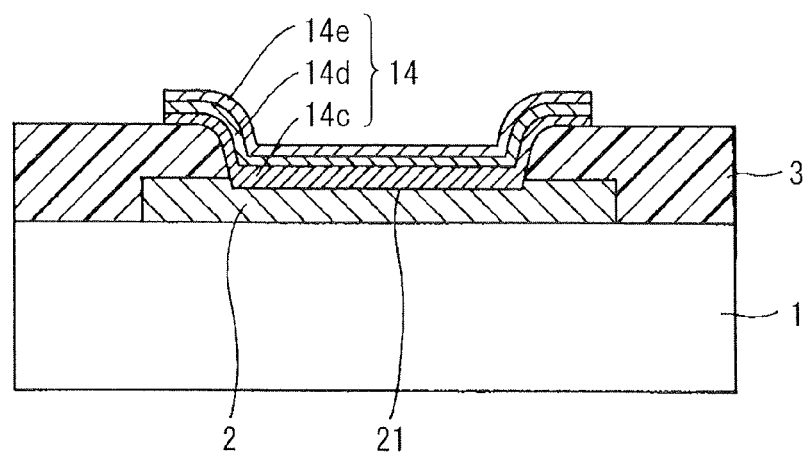
FIGS. 12A and 12B are diagrams illustrating a method of manufacturing a semiconductor device according to a second embodiment of the present invention.

According to the second embodiment, as shown in FIG. 12A, a second electrode layer 14 is formed in the tapered hole 31. Further, as shown in FIG. 12B, a conductor 60 is formed on the second electrode layer 14 and connected to the second electrode layer 14.

Like the first embodiment, a surface of the first electrode layer 2 is cut out by the tool bit 4 so that the contact surface 21 can be exposed. The contact surface 21 of the first electrode layer 2 serves as the bottom of the tapered hole 31. For example, the first electrode layer 2 can be made of aluminum. The second electrode layer 14 is formed on and around the bottom of the tapered hole 31. The second electrode 14 can be patterned in a shape shown in FIG. 12A by using a diamond grinding wheel, a GC (green SiC) grinding wheel, an electrodeposited grinding wheel, or the like. The conductor 60 is formed on and in contact with the second electrode layer 14.

For example, a power transistor can be formed in the semiconductor substrate 1. In such a case, the first electrode layer 2 can serve as an emitter electrode or a gate electrode. For example, when the first electrode layer 2 is an emitter electrode, the conductor 60 can be solder, and when the first electrode layer 2 is a gate electrode, the conductor 60 can be a bonding wire.

The second electrode layer 14 can be a plated layer. For example, the second electrode layer 14 can be a plated multilayer of Ti/Ni/Au, a plated multilayer of Ni/Au, a plated layer of Cu, or a plated layer of Ni—Fe alloy.

In an example shown in FIG. 12A, the second electrode layer 14 has a three-layer structure including a first layer 14c, a second layer 14d, and a third layer 14e. The first layer 14c is formed on the first electrode layer 2. The second layer 14d is formed on the first layer 14c. The third layer 14e is formed on the second layer 14d.

The first layer 14c provides a good connection with the first electrode layer 2. For example, the first layer 14c can be a thin titanium (Ti) layer. Alternatively, the first layer 14c can be made of vanadium (V), chromium (Cr), zirconium (Zr), aluminum (Al), tantalum (Ta), tungsten (W), nitride of these metals, or alloy mainly containing these metals. When the first layer 14c is a thin titanium layer, the first layer 14c can be oxidized by itself by reducing an oxide layer of the first electrode layer 2. Therefore, a process of removing the oxide layer can be omitted.

The second layer 14d is substantially connected to the conductor 60. For example, the second layer 14d can be a thin nickel (Ni) layer. Alternatively, the second layer 14d can be made of copper (Cu), palladium (Pb), or alloy mainly having these metals.

The third layer 14e can have a good wettability to solder. For example, the third layer 14e can be a gold (Au) layer. Alternatively, the third layer 14e can be made of copper (Cu), silver (Ag), platinum (Pt), iron (Fe), tin (Sn), or Cu—Sn alloy. When the second layer 14d is made of metal (e.g., nickel) having good wettability to solder, the third layer 14e can be omitted. However, in view of the fact that wettability to solder is degraded when a surface of a nickel layer is oxidized, it is preferable that the third layer 14e be formed on the second layer 14d.

Figure 12B:
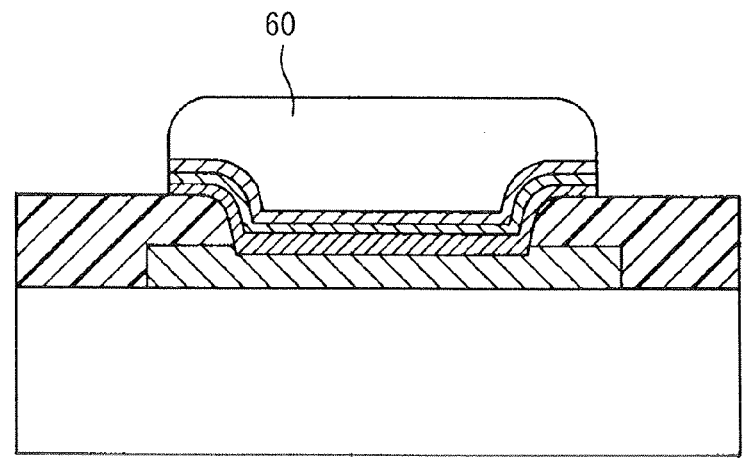

As shown in FIG. 12B, the conductor 60 is joined to the second electrode layer 14 at the third layer 14e. For example, when the third layer 14e is made of gold, the third layer 14e is melt into the conductor 60 and thus disappears. Therefore, after the conductor 60 is joined to the second electrode layer 14, the second electrode layer 14 has a two-layer structure including the first layer 14c made of, for example, titanium and the second layer 14d made of, for example, nickel.

For example, the resin insulation layer 3 can be made of polyimide resin. Specifically, the resin insulation layer 3 can be made of a mixture of polyimide resin and a material, such as Teflon (registered trademark), having a strength of 50 MPa or less, a material having a rigidity modulus of 0.3 GPa or less, and/or a material having a small coefficient of friction with diamond. In such an approach, cutting friction is reduced so that the cutting surface of the resin insulation layer 3 can be smooth.

Alternatively, the resin insulation layer 3 can be made of an inorganic material or a mixture of an inorganic material and an organic material. For example, when the resin insulation layer 3 is made of a mixture of an organic material and an inorganic material having a high thermal conductivity, thermal dissipation performance of the resin insulation layer 3 can be improved.

Alternatively, the resin insulation layer 3 is made of a mixture of an organic material and an inorganic material having a thermal coefficient of expansion close to a thermal coefficient of expansion of a material of a surrounding member such as an underlying member of the resin insulation layer 3. In such an approach, a difference in thermal coefficient of expansion between the resin insulation layer 3 and the surrounding member can be reduced.

For example, the conductor 60 can be an eutectic material, an anisotropic conductive paste, or an anisotropic conductive film. Alternatively, the conductor 60 can be a granular sintered material having a diameter of from 10 μm to 1 nm.

Such changes and modifications are to be understood as being within the scope of the present invention as defined by the appended claims.

What is claimed is:

1. A semiconductor device comprising:
a semiconductor substrate;
an electrode layer located on a surface of the semiconductor substrate; and
a resin insulation layer located on the surface of the semiconductor substrate to partially cover the electrode layer, wherein
the resin insulation layer and the electrode layer define a tapered hole having an opening defined by the resin insulation layer, a bottom defined by a first portion of the electrode layer, and a side wall connecting the opening to the bottom,
the electrode layer has a first thickness at the first portion and a second thickness at a second portion covered with the resin insulation layer,
the first thickness is less than the second thickness,
a step portion between the first portion and the second portion of the electrode layer and a side portion of the resin insulation layer define the side wall of the tapered hole,
an angle formed between the step portion of the electrode layer and the bottom of the tapered hole is equal to an angle formed between the side portion of the resin insulation layer and the bottom of the tapered hole,
a lower end of the side portion of the resin insulation layer is continuously joined to an upper end of the step portion of the electrode layer to form a continuous surface, and
as seen in profile from a top-to-bottom cross section, the opening of the tapered hole has a round shape with a radius of curvature equal to or greater than 1 micrometer,
further comprising
a plurality of tapered holes including the tapered hole, wherein
a first angle is formed between the side wall and the bottom of a first one of the plurality of tapered holes,
a second angle is formed between the side wall and the bottom of a second one of the plurality of tapered holes, and
the first angle is different than the second angle.

2. The semiconductor device according to claim 1, wherein the opening of the tapered hole is smaller than the bottom of the tapered hole so that the angle formed between the side wall and the bottom is less than 80°.

3. The semiconductor device according to claim 2, wherein the angle ranges from 55° to 65°.

4. The semiconductor device according to claim 1, wherein the bottom of the tapered hole has a round shape with a radius of curvature equal to or greater than 1 micrometer.

5. The semiconductor device according to claim 1, wherein a surface roughness, as a 10-point average roughness Rz defined in Japanese Industrial Standard (JIS), of the side wall ranges from 50 nanometers to 400 nanometers.

6. The semiconductor device according to claim 1, further comprising:
another electrode layer covering the side wall and the bottom of the tapered hole.

7. The semiconductor device according to claim 1, wherein the resin insulation layer has a breaking elongation of 60% or less.

8. The semiconductor device according to claim 1, wherein the tapered hole is formed by a tool bit with a rake angle of zero or a negative value.

* * * * *